(12) United States Patent
Tsuchiko

(10) Patent No.: US 9,214,457 B2
(45) Date of Patent: Dec. 15, 2015

(54) METHOD OF INTEGRATING HIGH VOLTAGE DEVICES

(75) Inventor: Hideaki Tsuchiko, San Jose, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 4 days.

(21) Appl. No.: 13/237,842

(22) Filed: Sep. 20, 2011

(65) Prior Publication Data
US 2013/0072004 A1    Mar. 21, 2013

(51) Int. Cl.
| | |
|---|---|
| *H01L 29/06* | (2006.01) |
| *H01L 29/735* | (2006.01) |
| *H01L 27/06* | (2006.01) |
| *H01L 27/082* | (2006.01) |
| *H01L 27/088* | (2006.01) |
| *H01L 21/8234* | (2006.01) |
| *H01L 21/8222* | (2006.01) |
| *H01L 21/8228* | (2006.01) |
| *H01L 21/761* | (2006.01) |
| *H01L 29/66* | (2006.01) |
| *H01L 29/732* | (2006.01) |
| *H01L 29/78* | (2006.01) |
| *H01L 29/10* | (2006.01) |
| *H01L 29/861* | (2006.01) |
| *H01L 29/423* | (2006.01) |

(52) U.S. Cl.
CPC .......... *H01L 27/0629* (2013.01); *H01L 21/761* (2013.01); *H01L 21/8222* (2013.01); *H01L 21/8228* (2013.01); *H01L 21/823481* (2013.01); *H01L 21/823493* (2013.01); *H01L 27/0623* (2013.01); *H01L 27/088* (2013.01); *H01L 27/0821* (2013.01); *H01L 27/0823* (2013.01); *H01L 29/063* (2013.01); *H01L 29/10* (2013.01); *H01L 29/1079* (2013.01); *H01L 29/1083* (2013.01); *H01L 29/66272* (2013.01); *H01L 29/732* (2013.01); *H01L 29/735* (2013.01); *H01L 29/7816* (2013.01); *H01L 29/7835* (2013.01); *H01L 29/8611* (2013.01); *H01L 29/42368* (2013.01)

(58) Field of Classification Search
USPC ........................................................ 438/492
See application file for complete search history.

(56) References Cited

U.S. PATENT DOCUMENTS

| | | | |
|---|---|---|---|
| 3,335,341 A | | 8/1967 | Hung Chang Lin |
| 3,466,510 A | * | 9/1969 | Maute Hans-Jurgen ...... 257/491 |
| 4,300,150 A | | 11/1981 | Colak |
| 4,458,158 A | * | 7/1984 | Mayrand ....................... 326/101 |
| 4,665,424 A | * | 5/1987 | Hirao ............................ 257/518 |

(Continued)

OTHER PUBLICATIONS

U.S. Appl. No. 13/237,852, filed Sep. 20, 2011 and listing Hideaki Tsuchiko as inventor.

*Primary Examiner* — Fernando L Toledo
*Assistant Examiner* — Christine L Hagan
(74) *Attorney, Agent, or Firm* — Kenneth C. Brooks

(57) ABSTRACT

The present invention is directed to a method for forming multiple active components, such as bipolar transistors, MOSFETs, diodes, etc., on a semiconductor substrate so that active components with higher operation voltage may be formed on a common substrate with a lower operation voltage device and incorporating the existing proven process flow of making the lower operation voltage active components. The present invention is further directed to a method for forming a device of increasing operation voltage over an existing device of same functionality by adding a few steps in the early manufacturing process of the existing device therefore without drastically affecting the device performance.

16 Claims, 13 Drawing Sheets

(56) References Cited

U.S. PATENT DOCUMENTS

| | | | |
|---|---|---|---|
| 4,697,332 A | 10/1987 | Joy et al. | |
| 4,800,172 A | 1/1989 | Okano et al. | |
| 4,887,142 A | 12/1989 | Bertotti | |
| 4,890,146 A * | 12/1989 | Williams | H01L 27/0727 257/336 |
| 4,918,026 A | 4/1990 | Kosiak et al. | |
| 4,979,001 A | 12/1990 | Alter | |
| 5,041,895 A | 8/1991 | Contiero et al. | |
| 5,047,820 A | 9/1991 | Garnett | |
| 5,087,889 A | 2/1992 | Butler | |
| 5,094,963 A * | 3/1992 | Hiraguchi | H01L 21/3225 148/DIG. 127 |
| 5,156,989 A * | 10/1992 | Williams et al. | 438/206 |
| 5,158,463 A | 10/1992 | Kim et al. | |
| 5,225,359 A | 7/1993 | DeLong | |
| 5,242,841 A | 9/1993 | Smayling et al. | |
| 5,273,912 A * | 12/1993 | Hikida | H01L 21/761 257/E21.544 |
| 5,286,995 A | 2/1994 | Malhi | |
| 5,296,393 A | 3/1994 | Smayling et al. | |
| 5,338,949 A | 8/1994 | Schoofs | |
| 5,355,014 A | 10/1994 | Rao et al. | |
| 5,387,552 A | 2/1995 | Iranmanesh | |
| 5,406,110 A | 4/1995 | Kwon et al. | |
| 5,408,125 A * | 4/1995 | Erdeljac et al. | 257/607 |
| 5,498,554 A | 3/1996 | Mei | |
| 5,517,046 A | 5/1996 | Hsing et al. | |
| 5,539,237 A | 7/1996 | Todd et al. | |
| 5,545,577 A | 8/1996 | Tada | |
| 5,556,796 A | 9/1996 | Garnett et al. | |
| 5,578,855 A * | 11/1996 | Gaffur | H01L 27/088 257/371 |
| 5,610,421 A | 3/1997 | Contiero et al. | |
| 5,614,755 A * | 3/1997 | Hutter | H01L 21/8249 257/471 |
| 5,698,457 A | 12/1997 | Noguchi | |
| 5,736,445 A | 4/1998 | Pfirsch | |
| 5,750,414 A | 5/1998 | Whitney | |
| 5,789,786 A * | 8/1998 | Gaffur | H01L 27/088 257/369 |
| 5,854,566 A | 12/1998 | Kwon et al. | |
| 5,856,695 A | 1/1999 | Ito et al. | |
| 5,911,104 A | 6/1999 | Smayling et al. | |
| 5,913,114 A | 6/1999 | Lee et al. | |
| 6,096,589 A | 8/2000 | Lee et al. | |
| 6,127,213 A | 10/2000 | Tung | |
| 6,207,510 B1 | 3/2001 | Abeln et al. | |
| 6,211,552 B1 | 4/2001 | Efland et al. | |
| 6,242,787 B1 | 6/2001 | Nakayama et al. | |
| RE37,424 E * | 10/2001 | Contiero | H01L 27/0922 257/370 |
| 6,306,700 B1 | 10/2001 | Yang | |
| 6,352,887 B1 | 3/2002 | Hutter et al. | |
| 6,365,447 B1 * | 4/2002 | Hebert et al. | 438/203 |
| 6,410,377 B1 | 6/2002 | Hwang et al. | |
| 6,525,376 B1 | 2/2003 | Harada et al. | |
| 6,593,621 B2 | 7/2003 | Tsuchiko et al. | |
| 6,818,494 B1 | 11/2004 | Chen et al. | |
| 6,833,586 B2 | 12/2004 | Tsuchiko | |
| 6,844,578 B2 | 1/2005 | Harada et al. | |
| 6,894,349 B2 | 5/2005 | Beasom | |
| 6,900,091 B2 | 5/2005 | Williams et al. | |
| 6,995,453 B2 | 2/2006 | Kim et al. | |
| 7,019,377 B2 | 3/2006 | Tsuchiko | |
| 7,166,893 B2 | 1/2007 | Taniguchi et al. | |
| 7,291,884 B2 * | 11/2007 | Darwish | H01L 21/2253 257/330 |
| 7,435,650 B2 * | 10/2008 | Darwish | H01L 21/2253 257/330 |
| 7,514,754 B2 * | 4/2009 | Ma et al. | 257/370 |
| 7,619,299 B2 * | 11/2009 | Mita | H01L 21/82285 257/555 |
| 7,719,055 B1 | 5/2010 | McNutt et al. | |
| 7,759,759 B2 | 7/2010 | Tsuchiko | |
| 2005/0253216 A1 | 11/2005 | Tsuchiko | |
| 2011/0079825 A1 | 4/2011 | Tsuchiko | |

\* cited by examiner

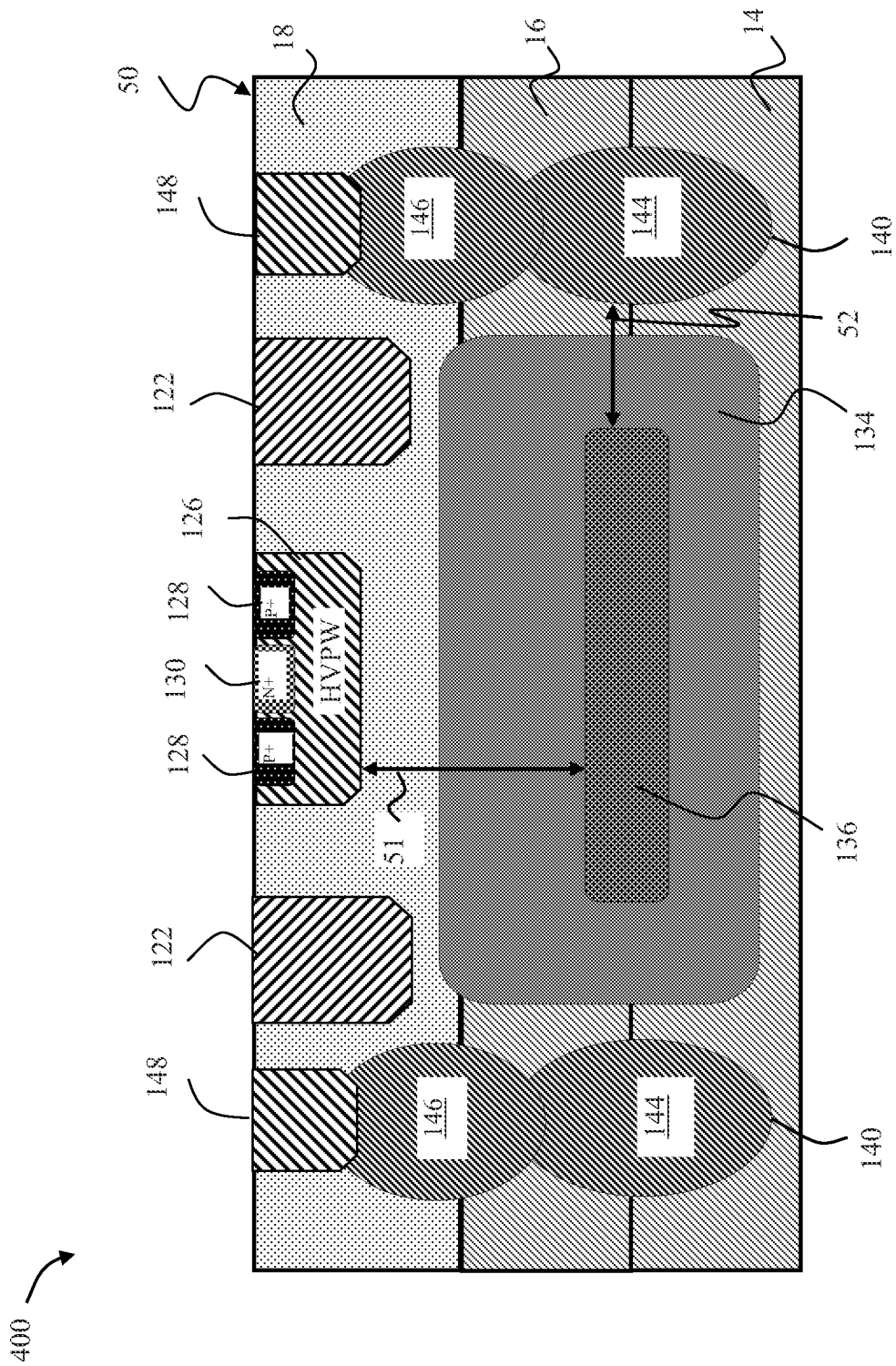
FIG. 11 – HV VNPN

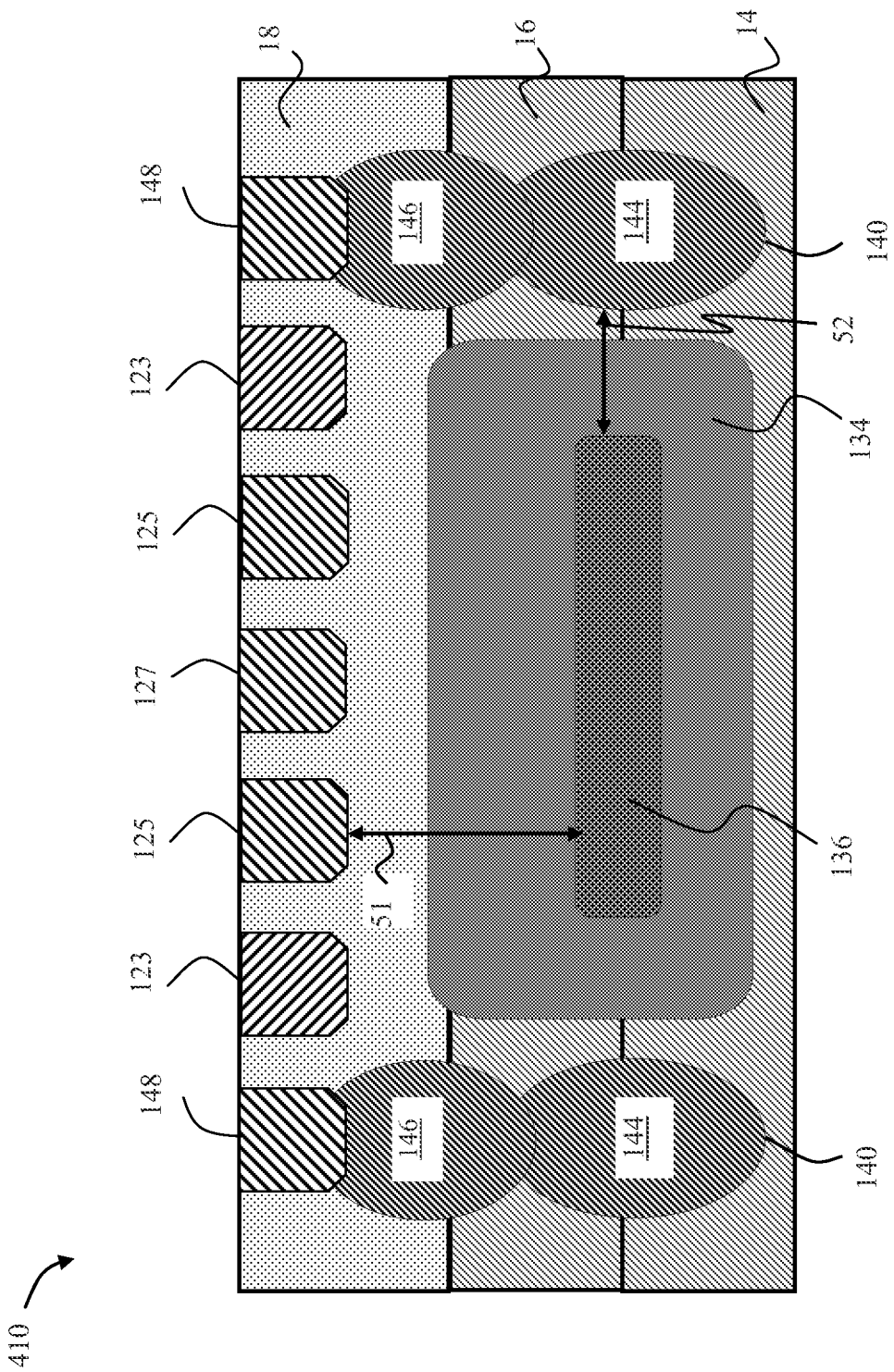
FIG. 12 – HV LPNP

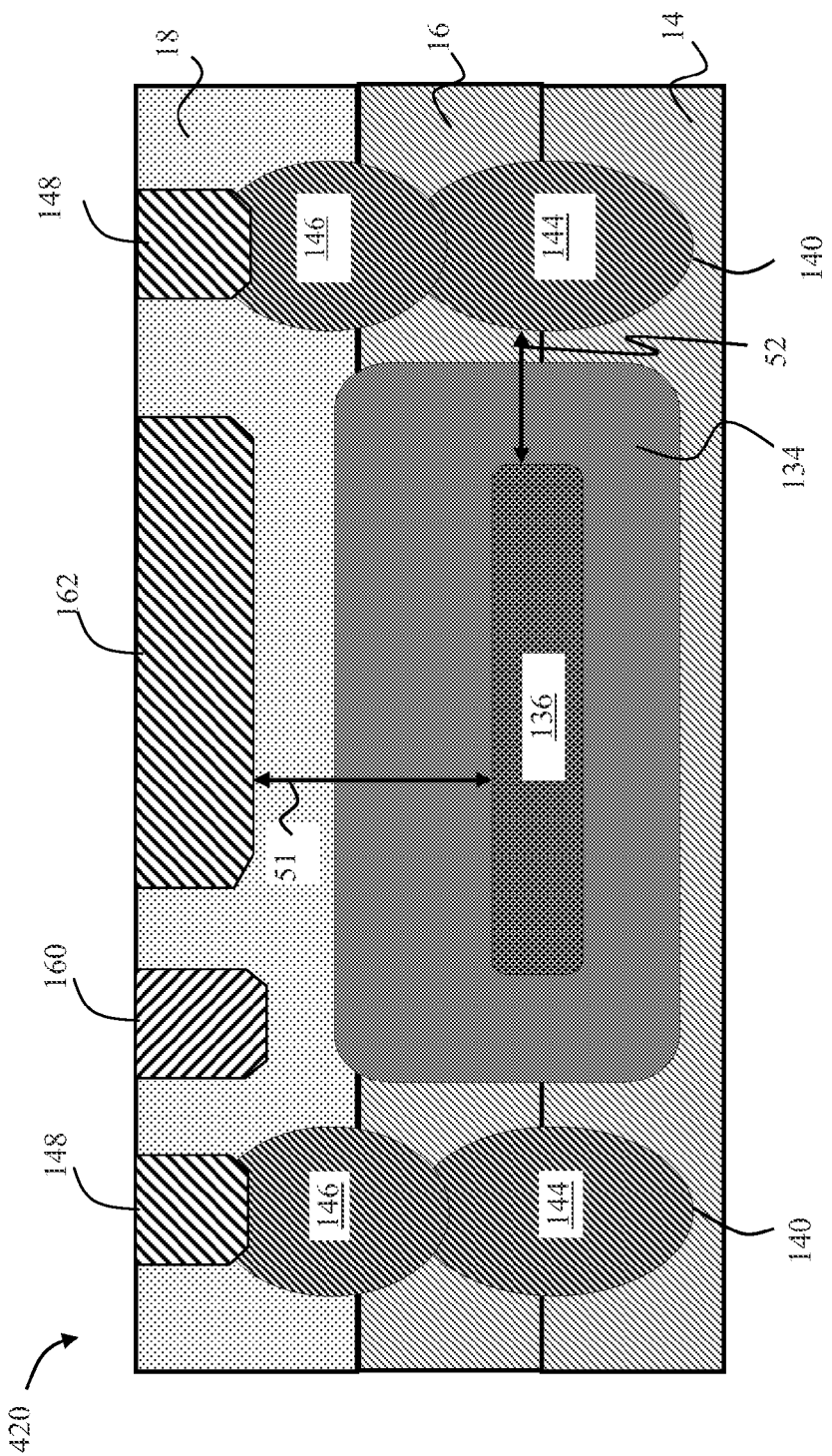
FIG. 13 – HV PN Diode

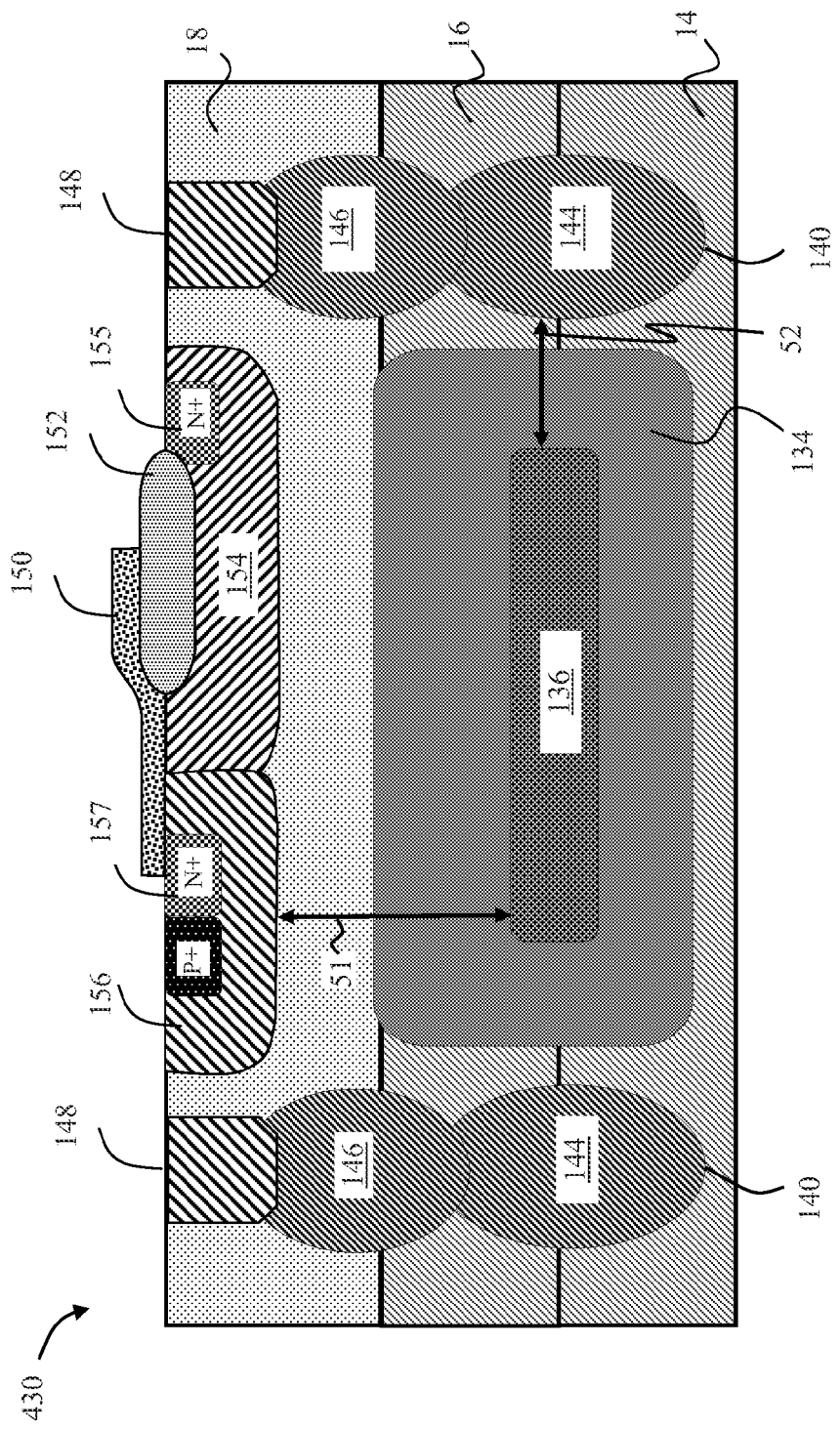
FIG. 14 – HV NLDMOS

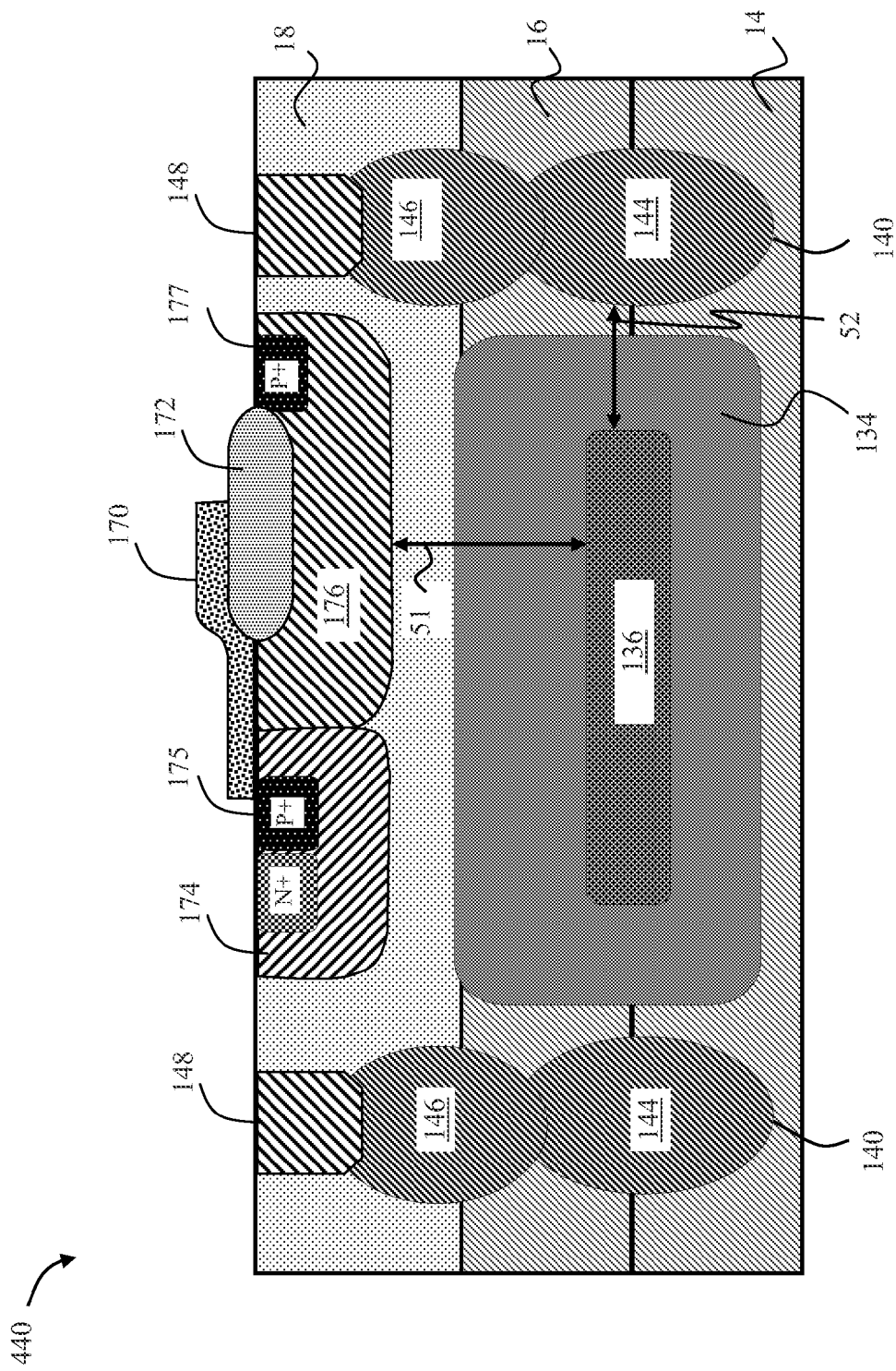
FIG. 15 – HV PLDMOS

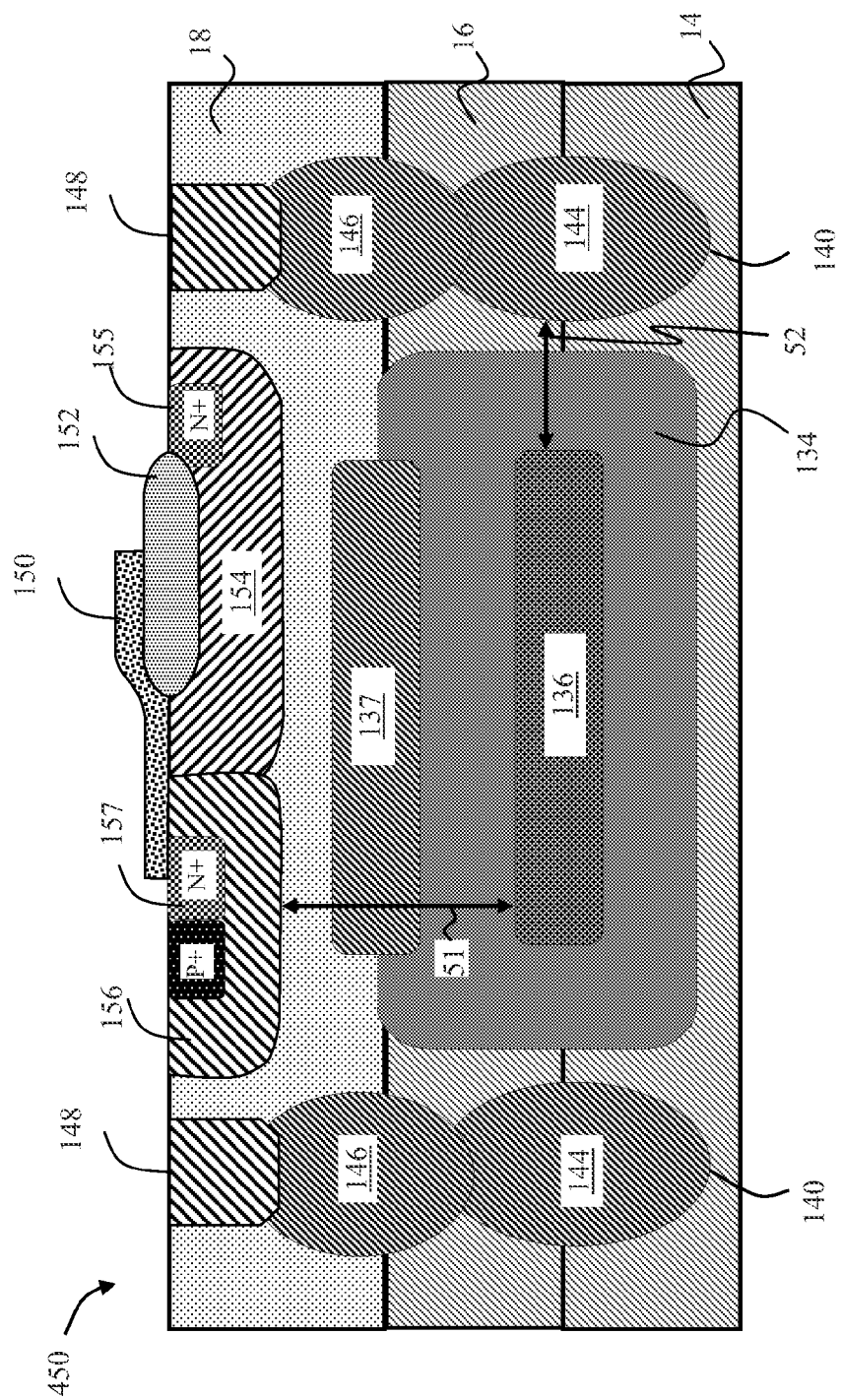
FIG. 16 – VHV NLDMOS

METHOD OF INTEGRATING HIGH VOLTAGE DEVICES

CROSS-REFERENCE TO RELATED APPLICATION

The present application is related to concurrently filed and commonly assigned U.S. patent application Ser. No. 13/237,852, entitled "SEMICONDUCTOR CHIP INTEGRATING HIGH AND LOW VOLTAGE DEVICES" and having Hideaki Tsuchiko identified as an inventor thereof.

BACKGROUND OF THE INVENTION

The invention relates to high voltage semiconductor devices and the manufacturing process thereof and, in particular, to modular techniques for adding high voltage devices to an existing process flow for semiconductor devices.

Devices having higher voltage rating than existing devices are often required to be integrated on a chip of existing device to satisfy the demand of new applications. In many cases such integration of higher voltage device into existing lower voltage device requires drastic change to the proven process flow and/or conditions for manufacturing, the existing lower voltage device resulting in performance deterioration of the existing lower voltage device to a degree that device models will have to be updated. To avoid the long design cycle and high cost of new technology development, efforts have been focused on techniques that require only minor changes to the existing low voltage device process conditions thus minimizing the impact to the performance of existing lower voltage device.

Generally in BCD (Bipolar CMOS DMOS) or BiCMOS (Bipolar CMOS) technologies, the highest operating voltage is limited by reach-through breakdown of a vertical structure of P to N junction. This vertical junction breakdown is a function of Epi thickness, doping concentration and junction depth. FIG. 1 shows an example of an existing device 300 formed in a semiconductor chip comprising an n-type epitaxial layer 18 having a thickness 43 disposed on a P substrate 14. Without showing the detail structure of the device 300, a number of N-wells 22 and P-wells 26 and 48 are provided in the N-Epi layer. Buried P regions 46 extend from the bottoms of N-Epi layer upward into the bottom edge of P-well 48 and merge together. Buried P regions also extend downwards into the substrate material 14, thus, providing isolation of the device 300 from the rest area of the semiconductor chip where other devices may be formed. Device 300 further comprises an N buried region 35 under the P-well 26 to prevent punch through between P-well and P substrate which limits the maximum operating voltage of the device 300. Using a certain thickness of Epi 18 and controlling the depth 45 of P-well 26 to optimize the performance of device 300, the vertical space 47 between the bottom of P-well 26 and the top of buried N region 35 limits a vertical breakdown voltage therefore limit the operating voltage of device 300 when a lateral breakdown controlling factor 49, namely the lateral distance between the buried P regions 46 and the N buried region 35, is large enough that a lateral breakdown voltage is much higher than the vertical breakdown voltage. The manufacturing process would start with the substrate material 14 then implant ions for regions 35 and 46 to be formed respectively in later steps. The epitaxial layer 18 is then disposed on top of the substrate material 14 and multiple N-wells and P-wells are formed extending downwards from the top surface of the epitaxial layer. Additional steps may be carried out to form a specific function such as a bipolar transistor or a MOSFET. In the case a higher operating voltage device is required to be integrated in a separate area on the same substrate, one method to increase P to N vertical breakdown voltage is to increase the thickness of Epi layer 18. This will affect the performance and isolation of existing device 300 if the process and condition of making device 300 remain the same.

Another method is introducing a lighter doping layer to reduce the doping concentration and shallow P well junction. For example, Hideaki Tsuchiko discloses in U.S. Pat. No. 7,019,377 an integrated circuit that includes a high voltage Schottky barrier diode and a low voltage device. The Schottky barrier diode includes a lightly doped and shallow p-well as a guard ring while the low voltage devices are built using standard, more highly doped and deeper p-wells. By using a process including lightly doped p-wells and standard p-wells and increased thickness of N-Epi, breakdown voltage, hence, maximum operating voltage of high voltage devices can be improved. Each method can improve breakdown voltage by 15V to 30V. The Schottky barrier diode using both methods can improve its breakdown voltage 30V to 60V without significantly affecting performance of other devices and structures.

Combination of both methods and device layout enable integrating high and low voltage devices on the same chip. However, these methods often have a minor affect to existing device performances. Some devices require a minor tweak to SPICE models. Especially increasing the N-Epi thickness has a certain limitation. Isolation link-up between up-diffusion of Hype buried region 46 and down-diffusion of Pwell 48 will weaken or may break up, if N-Epi thickness is significantly increased, resulting in incomplete device isolation. Therefore it is highly desirable to develop new techniques to integrate a high voltage device into a low voltage chip that require only inserting a few steps to existing low voltage process flow without impacting the performance of the low voltage device.

SUMMARY OF THE INVENTION

The present invention is directed to a method for forming multiple active components, such as bipolar transistors, MOSFETs, diodes, etc., on a semiconductor substrate so that active components with higher operating voltage may be formed on a common substrate with a lower operating voltage active components and incorporating the existing proven process flow of making the lower operating voltage active components.

The present invention is further directed to a method for forming a device of increased operating voltage over an existing device by adding a few steps in the early manufacturing process of the existing device therefore without affecting the device performance. Specifically the method including the steps of providing a substrate material of a first conductivity type; growing a first epitaxial layer of the first conductivity type on top of the substrate; growing a second epitaxial layer of the second conductivity type on top of the first epitaxial layer; forming a deep buried region of the second conductivity including a lightly doped region extending to the first epitaxial layer and a highly doped region surrounded by the lightly doped region; and forming a first doped well of the first conductivity type extending downwards from a top surface of the second epitaxial layer above the deep buried highly doped region.

These and other embodiments are described in further detail below.

BRIEF DESCRIPTION OF THE DRAWINGS

FIG. 11 is a cross-sectional view of a higher operating voltage vertical NPN bipolar transistor according to the present invention;

FIG. 12 is a cross-sectional view of a higher operating voltage lateral PNP bipolar transistor according to the present invention;

FIG. 13 is a cross-sectional view of a higher operating voltage PN diode according to the present invention;

FIG. 14 is a cross-sectional view of a higher operating voltage lateral N-channel DMOS according to the present invention;

FIG. 15 is a cross-sectional view of a higher operating voltage lateral P-channel DMOS according to the present invention;

FIG. 16 is a cross-sectional view of a higher operating voltage lateral N-channel DMOS with triple RESURF according to the present invention.

DETAILED DESCRIPTION OF THE INVENTION

Figure 2:
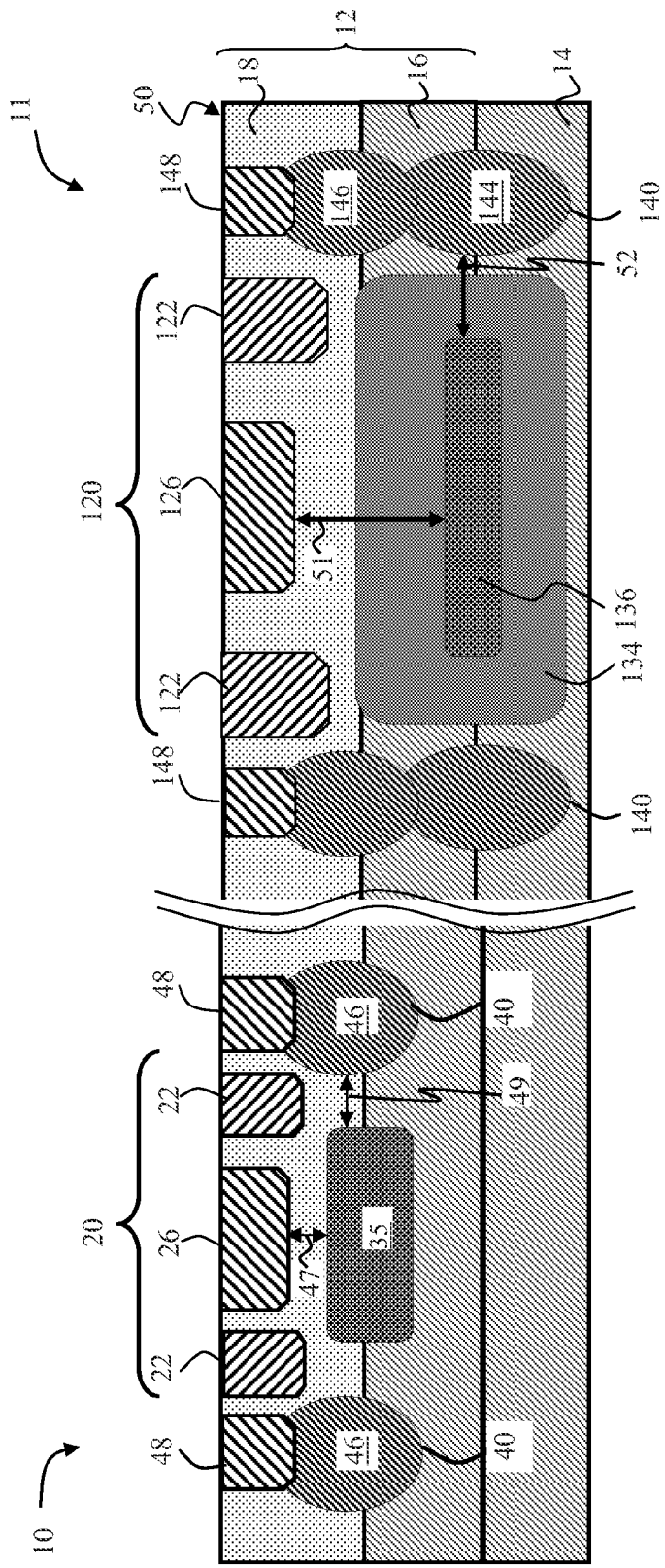
FIG. 2 is a cross-sectional view of a higher operating voltage device fabricated on a common substrate with a lower operating voltage device of FIG. 1 in accordance with one aspect of the present invention.

Referring to FIG. 2 in accordance with the present invention, first and second devices 10 and 11 of different operating voltage ratings are formed on a common semiconductor chip having a substrate material 14, a first epitaxial layer 16 stacking on top of substrate material 14 and a second epitaxial layer 18 stacking on top of the first epitaxial layer 16. The epitaxial layer 16 is doped to substantially the same concentration as the substrate material 14. Substrate 14 and epitaxial layer 16 are preferably p-type. The second epitaxial layer 18 formed on epitaxial layer 16 is preferably n-type. Layers 16 and 18 define a layer stack 12.

Active region 20 of device 10 is formed in the n-type epitaxial layer 18. Without showing the detail structure of device 10, a number of N-wells 22 and P-wells 26 and 48 are provided in the N-Epi layer. A greater concentration of n-type dopant is present in wells 22 than is present in layer 18, P-type well 26 is present in a greater doping concentration than are present in epitaxial layer 16 and substrate 14. A buried region of n-type dopant, referred to as a buried region 35, extends between p-epitaxial layer 16 and n-epitaxial layer having a controlled vertical space 47 less than the thickness of epitaxial layer 18 between the bottom of P-well 26 and the top of buried N region 35. The buried N region 35 is limited to a vicinity around the interface between p-epitaxial layer 16 and n-epitaxial layer 18 such that a substantially greater concentration of n-type dopant is present in buried region 35 than is present in layer 18.

Figure 1:
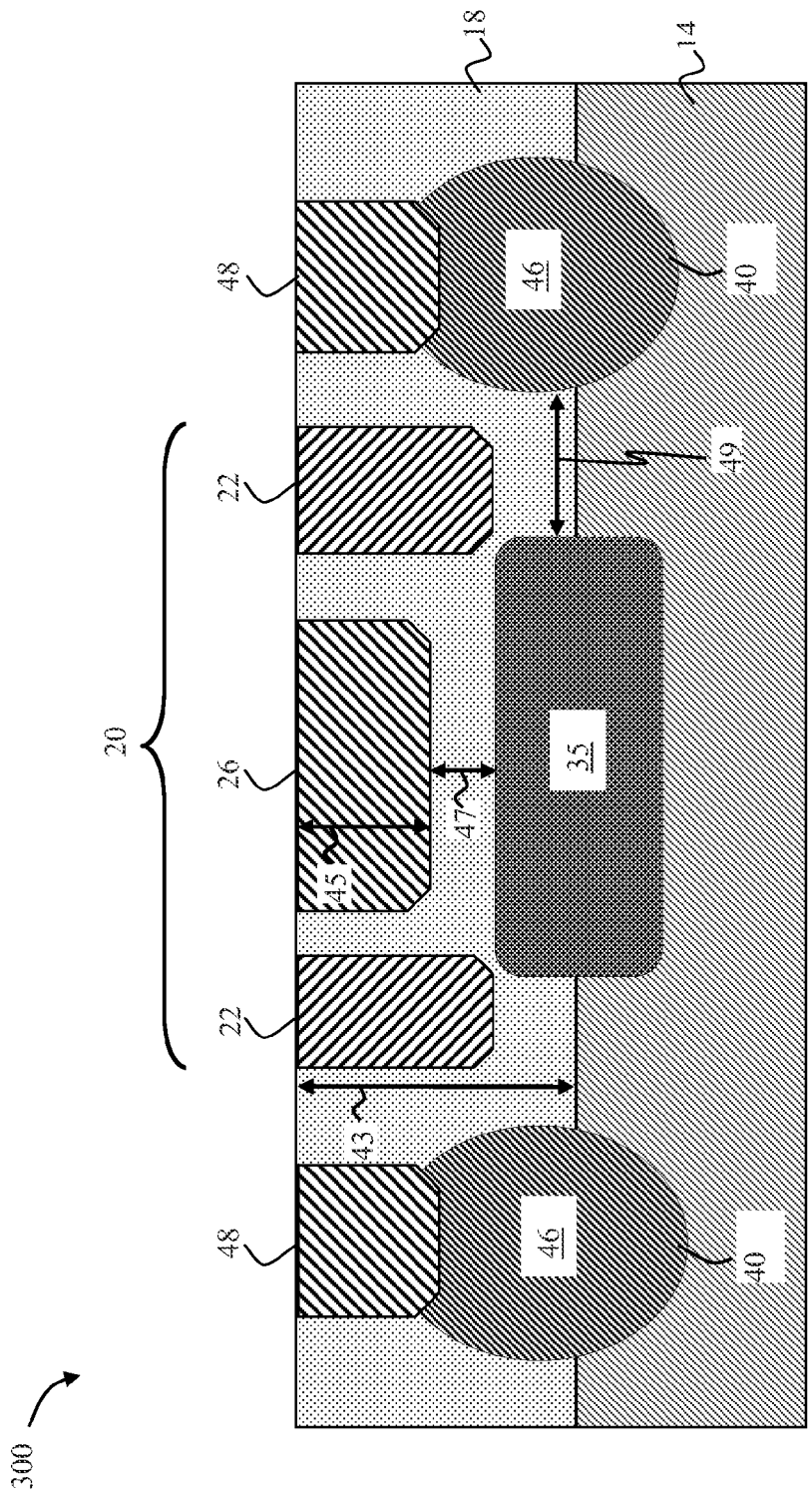
FIG. 1 is a cross-sectional view of an existing device fabricated on a substrate in accordance with one aspect of the present invention.

Disposed on opposing sides of active region 20 and buried region 35 are isolation regions 40. Isolation regions 40 are formed from a plurality of regions having p-type dopant concentrated therein in quantities greater than are present in either substrate 14 or epitaxial layer 16. Specifically, each of isolation regions 40 comprises of a high voltage P well (HVPW) 48 located at a top portion of the n-type epitaxial layer 18 and overlaps a buried region of p-type buried regions 46 extending between n-type epitaxial layer 18 to the p-type epitaxial layer 16, Device 10 is identical to the device 300 shown in FIG. 1, except that device 10 has an additional epitaxial layer 16 formed on top of the substrate. Since the epitaxial layer 16 has the same doping concentration as the substrate material 14, the performance of device 10 is identical to the device 300 as the epitaxial layer 16 can be considered as an extension of substrate material 14. The existing manufacturing process and conditions of making device 300 can be transferred in whole as a process module of making device 10.

Also formed in substrate 14 and layer stack 12 is device 11 in accordance with the present invention. Device 11 includes, formed into layer 18, an active region 120. Without showing the detail structure of device 11, a number of N-wells 122 and P-wells 126 and 148 are provided in the N-Epi layer 18. A greater concentration of n-type dopant is present in wells 122 than is present in regions of layer 18 outside of wells 122. P-type dopant of well 126 may be present in a greater concentration than are present in layer 16 and substrate 14. A deep buried region of n-type dopant, referred to as a deep buried region 134, extends between substrate 14 and layer stack 12. Deep buried region 134 has two different species, which includes a highly doped first n-type portion, referred to as deep buried highly doped region 136 and a lightly doped second n-type portion, referred to as deep buried lightly doped region 138 with second portion 134 surrounding the first portion 136. Preferably highly doped first n-type portion 136 is limited to a vicinity around the interface between the substrate material 14 and the p-epitaxial layer 16 such that a substantially greater concentration of n-type dopant is present in highly doped first n-type portion 136 than is present in layer 16. The second n-type portion extending upward reaches the second epitaxial layer 18 and preferably has a doping concentration substantially the same as layer 18.

For a given temperature, the second n-type dopant in portion 134 diffuses at a faster rate than the first n-type dopant in portion 136. In the present example the dopant concentrated in region 136 is antimony or arsenic and the dopant concentrated in region 138 is phosphorous.

Disposed on opposing sides of active region 120 and deep buried region 134 are isolation regions 140. Isolation regions 140 are formed from a plurality of regions having p-type dopant concentrated therein in quantities greater than are present in either substrate 14 or layer 16 of layer stack 12. Specifically, isolation regions 140 are each comprised of three overlapping regions 144, 146 and 148 of p-type doping concentrations. A first buried region 144 extends between substrate 14 and first layer 16. A second buried region 146 overlaps with buried region 144 and extends between first epitaxial layer 16 and second epitaxial layer 18. A third well 148 overlaps with the second buried region 146 and extends from surface 50 of second layer 18 toward first layer 16. It should be understood that isolation regions 140 function to isolate active region 120 from adjacent device active regions, one of which is shown as active region 20 formed on substrate 14 and in layer stack 12.

There are three breakdown voltages to consider with the device 11. First, buried regions 134 and 136 to substrate material 14 outside active region 120. This breakdown voltage can be controlled by doping concentrations of 134, 136 and 14 and doping profiles of 134 and 136. Second, a lateral breakdown voltage inside active region 120 is controlled by the lateral distance 52 between regions 134 and 136 and isolation regions 140 and doping concentrations and profiles of regions 134, 136, 14, 16 and 140. Third, a vertical breakdown voltage inside active region 120 is controlled by a vertical distance 51 between region 136 and region 126 and doping concentrations and profiles of regions 134, 136, 18 and 126. The second lateral breakdown voltage can be easily increased much higher than the vertical breakdown voltage by placing isolation regions 140 apart from active device region 120. Therefore, the maximum operating voltage of device 120 is limited by the third vertical breakdown.

To fabricate devices 10 and 11 on a semiconductor chip a p-type substrate 14 is provided and deep buried regions 100 and 101 are formed in the high voltage device area on top surface thereof the substrate 14 at step 200, shown in FIGS. 3-6. The dopant is implanted using well known implantation and masking processes to obtain a desired doping concentration. Specifically, deep buried region 101 includes two different types of n-type dopant that have different rates of diffusion coefficient for a given temperature. In the current example, the first n-type dopant is antimony or arsenic and the second dopant is phosphorous, both of which are implanted into a same deep buried region 101 on substrate 14 with two step implantation. Deep buried regions 100 include a concentration of p-type dopant. The low voltage device area is covered by photo resist to block the ion implant in this step.

Figure 3:
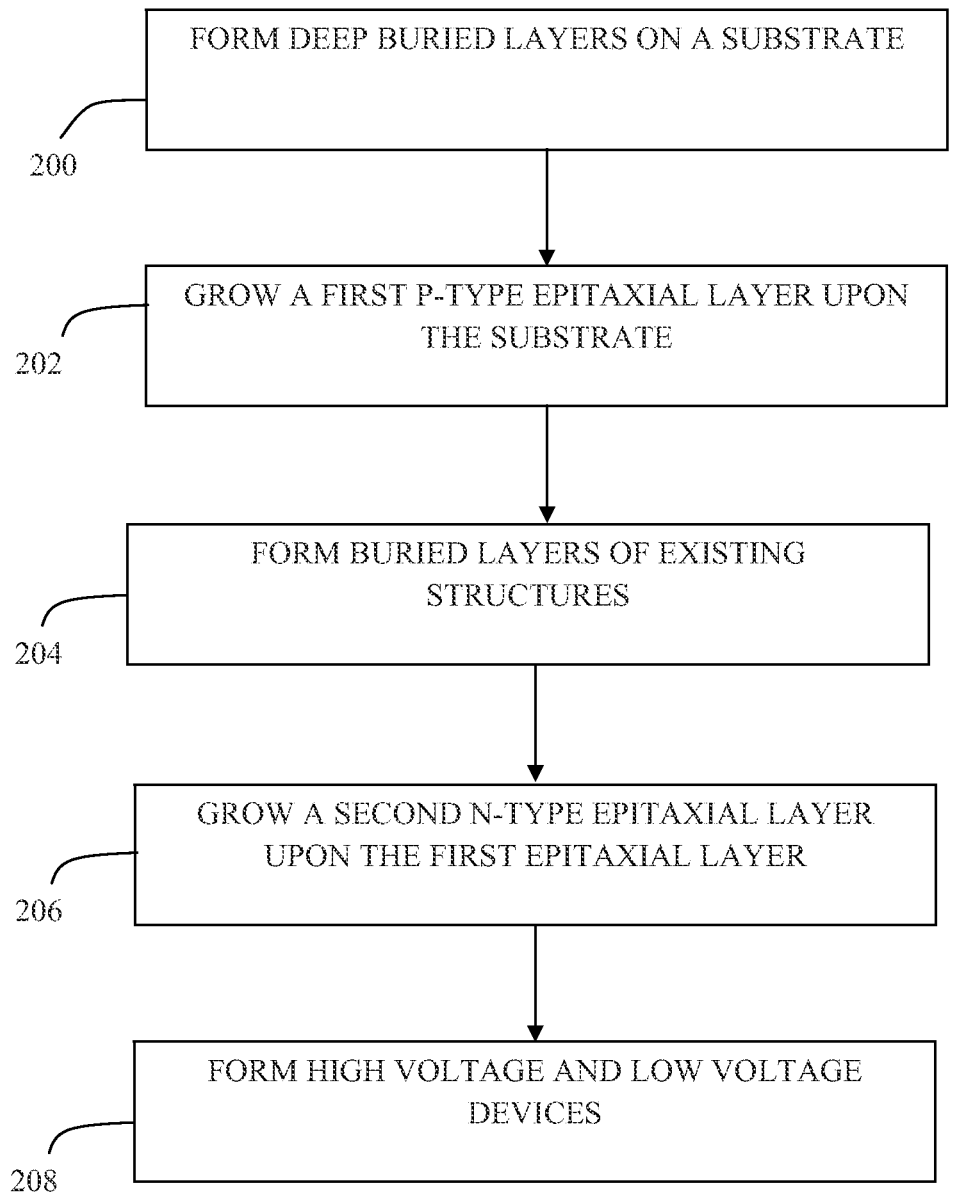
FIG. 3 is a flow diagram showing a method of fabricating the structure shown in FIG. 2.
Figure 4:
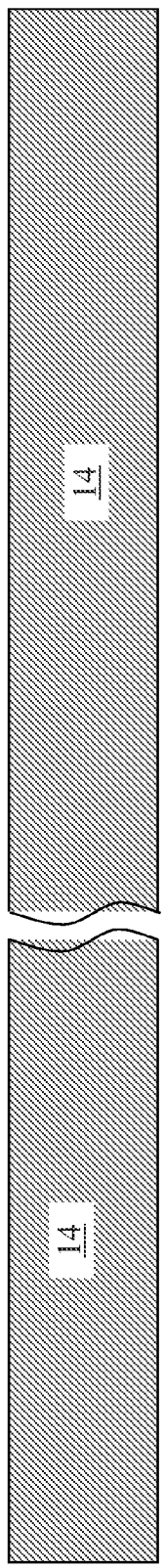
FIGS. 4-10 show cross-sectional views of the active devices shown in FIG. 2 at different steps of the fabrication process shown in FIG. 3.
Figure 5:
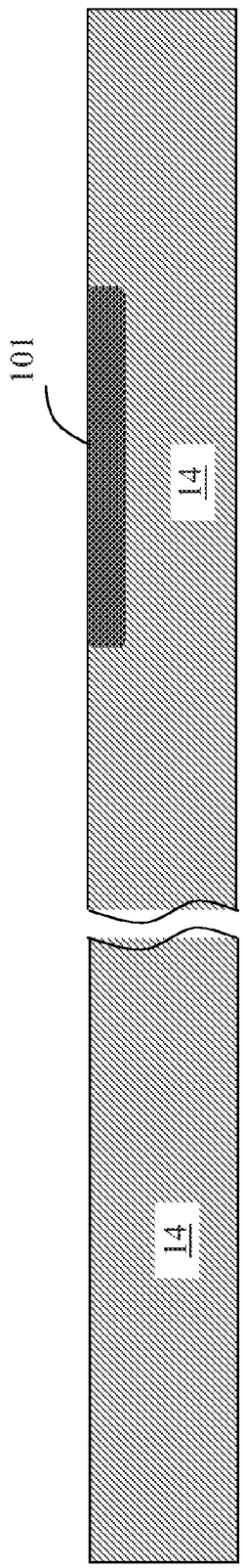
Figure 6:
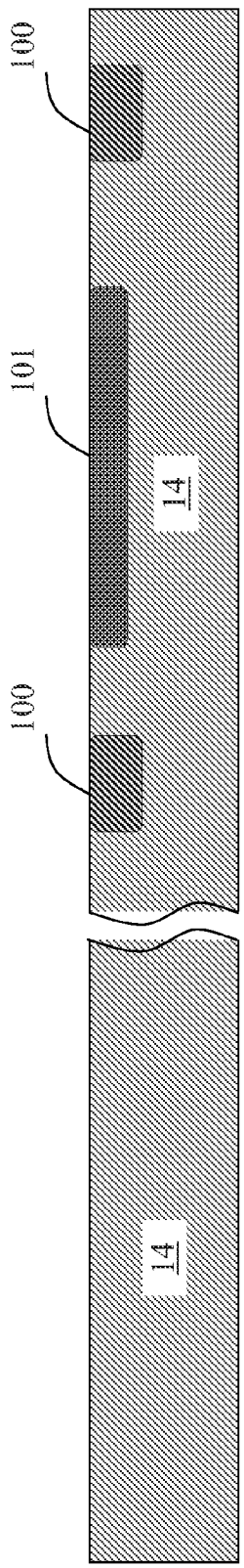
Figure 7:
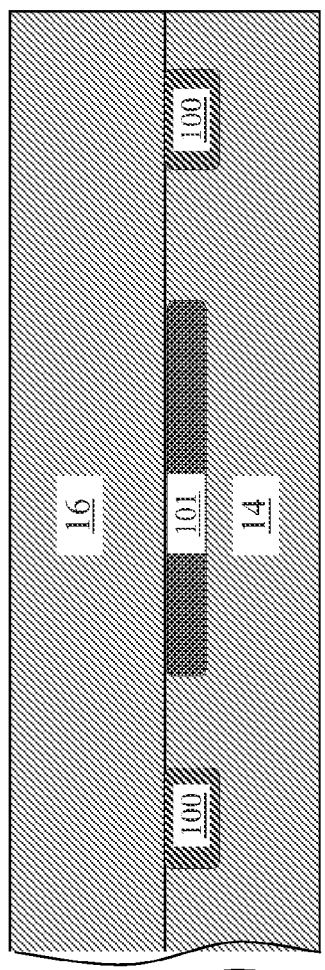
Figure 7:
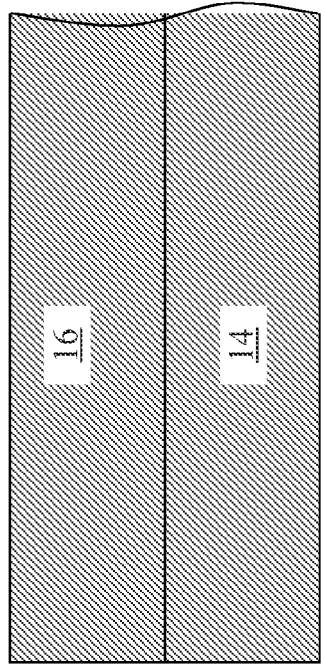
Figure 8:
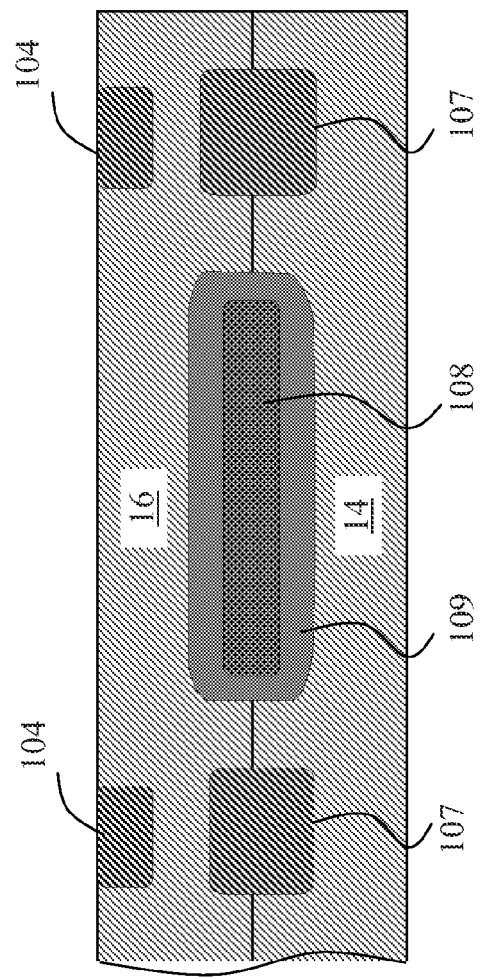
Figure 8:
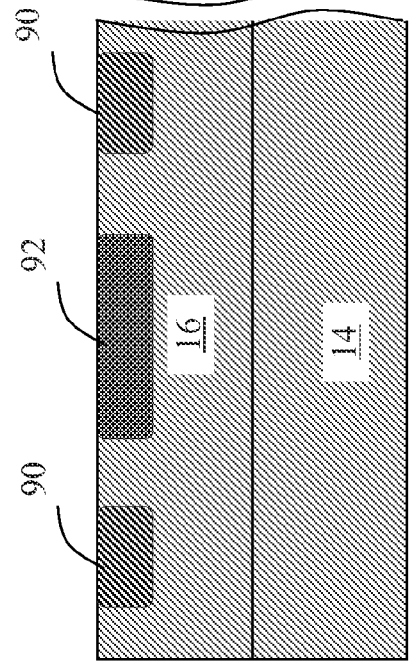

Referring to FIGS. 3 and 7, epitaxial layer 16 is grown upon the substrate 14 at step 202 all over the areas. Epitaxial layer 16 preferably has the same p-type dopant and same doping concentration as substrate 14. At step 204, buried regions 104, shown in FIG. 8, are formed on epitaxial layer 16 and on top of the deep buried regions 100 in the higher operating voltage area. During step 204, buried regions 90 and 92 are formed in the epitaxial layer 16 in furtherance of forming lower operating voltage device 10. Buried regions 90 and 104 include p-type dopant, and buried region 92 includes n-type dopant. The doping concentration in regions 90 and 104 are greater than the doping concentration in the remaining regions of layer 16. This is followed by a thermal anneal that results in the dopants in deep buried regions 100 and 101, shown in FIG. 7, diffusing into both substrate and the first epitaxial layer 16, forming regions 107, 108 and 109, shown in FIG. 8. Specifically, the difference in the diffusion coefficient between antimony and phosphorous, i.e. phosphorous diffuses faster than antimony, results in region 109 surrounding region 108, as discussed above.

Figure 9:
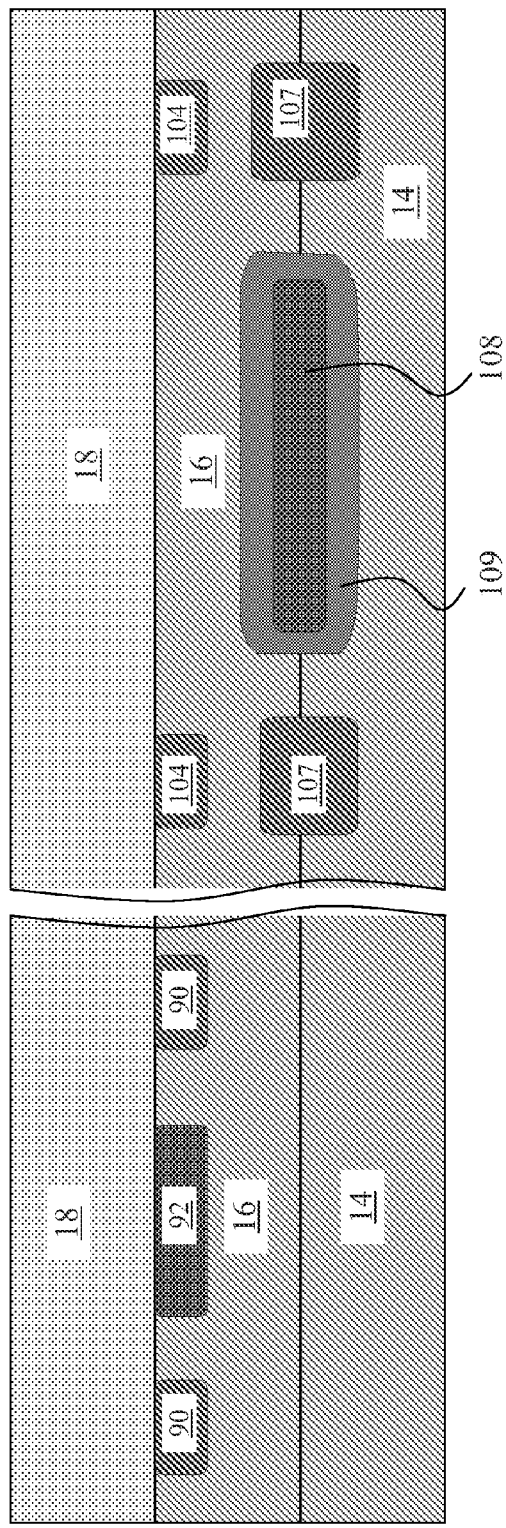

Referring to FIGS. 3 and 9 following step 206, epitaxial layer 18 is grown upon layer 16, at step 206. Epitaxial layer 18 includes n-type dopant.

Figure 10:
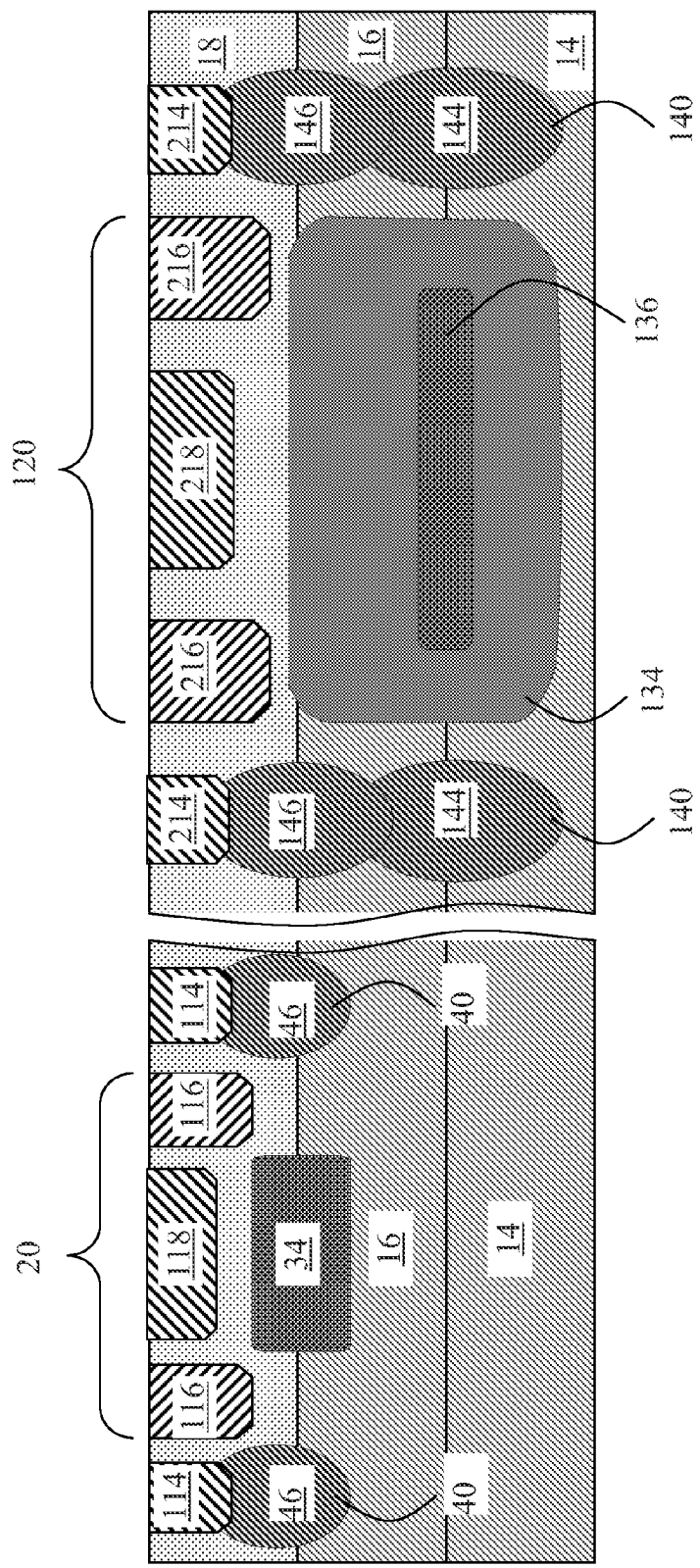

At step 208 and referring to FIG. 10, active regions of p-type dopant are implanted into sub-regions 114, 118, 214 and 218 into epitaxial layer 18, followed by implantation of n-type dopant into sub-regions 116 and 216. After implantation of dopants in sub-portions 114, 116, 118, 214 and 216 and 218, thermal cycles are applied to drive the dopants into layer 18 sufficiently to provide the desired doping concentrations and profiles. Buried region 34 is formed by diffusion of dopant in region 92. Deep buried region 134 and 136 are formed by diffusion of dopants in regions 108 and 109, respectively. Lightly doped phosphorous in region 109 expands upward and converts p-type epitaxial layer 16 to lightly doped n-type, which has similar doping concentration to that of epitaxial layer 18. Isolation regions 40 are formed by the diffusion of dopant in regions 90. Isolation region 140 is formed by merging the diffused dopant in regions 107, 104 and 214. As a result, buried region 34, deep buried region 134, including highly doped buried region 136 and lightly doped buried region 134 isolation regions 40 and 140; and active regions 20 and 120 are formed.

Referring to FIG. 2, n-type region 134 converted in p-type epitaxial layer 16 functions as if n-type epitaxial layer 18 is extended downward, therefore, the effective vertical distance 51 between region 136 and region 126 is wider compared to the vertical distance 47 between region 35 and region 26. As a result the device 120 has higher vertical breakdown voltage, hence, higher operating voltage than that of device 20.

Referring to FIGS. 3 and 10, at step 208 active region of device 10 is formed by dopant being implanted into N-well regions 116 and P-well region 118 to configure the specific device structure of device 10 and active region of device 11 is formed by dopant being implanted into N-well regions 216 and P-well region 218 to configure specific device structure of device 11. It should be understood that although shown as a single step for ease of discussion, implantation of n-type and p-type dopants at step 208 occurs in multiple steps under conventional implantation and masking processes. As previously mentioned the proven process and conditions of making device 300 can be transferred in its entirety and implemented starting from step 204. It should be understood that both existing devices and newly added devices of the present invention having lower voltage rating and higher voltage rating, respectively, will co-exist on the same substrate material without affecting each other.

The process step 208 shown in FIG. 10 provides a semiconductor chip having a higher voltage device integrated with a lower voltage device. It is understood that device 10 or 11 can be a diode, a bipolar transistor, a MOSFET or other devices. It is further understood that any device combination can be integrated together without affecting each other using the techniques disclosed by this invention. FIG. 11 shows an embodiment of device 11 provided as a high voltage vertical NPN transistor (VNPN) 400 integrated with an existing low voltage device (not shown). Device 400 is the same as device 11 except that the active area of device 400 includes a highly doped N+ region 130 disposed in the high voltage P-well 126. The highly doped N+ region 130, the P-well 126 and the N regions including a portion of the N-Epi layer 18 and deep buried N region 134 below the P-well 126 configures a vertical NPN with N+ region 130 provided as the emitter, P-Well 126 provided as the base and the N regions below the HVPW 126 provided as the collector. The P+ regions 128 disposed in HVPW 126 provide contact pickups to the base while the N regions 122 disposed in top portion of the N-Epi layer outside of the HVPW 126 provide contact pickups to the collector, Depending on the doping concentration of N regions 122, highly doped N+ regions may be disposed therein to improve ohmic contact to metals electrodes (not shown). The base and collector contact pickups may be formed as ring shapes in layout. The distance 51 between a bottom of the base region 126 and a top of the deep buried highly doped region 136 controls the vertical breakdown of the NPN transistor therefore limits the operating voltage of the NPN transistor 400.

FIG. 12 shows an alternate embodiment of device 11 provided as a high voltage lateral PNP transistor (LPNP) 410 integrated with an existing low voltage device (not shown). Device 410 is the same as device 11 except that the active area of device 410 is configured as a lateral PNP including a P region 127 provided as the emitter, a P ring 125 provided as the collector encircling the central P emitter region 127, and a N ring 123 provided as base contact pickup encircling the collector P ring 125 and the emitter P region 127. The base region includes a portion of the N-Epi layer 18 and the deep buried N region 134, which further includes the deep buried highly doped region 136 enclosed within a lightly doped buried region 134. The distance 51 between a bottom of the P collector region 125 and a top of the deep buried highly doped region 136 controls the vertical breakdown of the PNP transistor therefore limits the operating voltage of the PNP transistor 410.

FIG. 13 shows an alternate embodiment of device 11 provided as a high voltage PN diode 420 integrated with an existing low voltage device (not shown). Device 420 is the same as device 11 except that the active area of device 420 is configured as a PN diode including a P region 162 provided as the anode and an N region 160 as contact pickup for the cathode that includes a portion of the N-Epi layer 18 and the deep buried region 134. The distance 51 between a bottom of the anode P region 162 and a top of the deep buried highly doped region 136 controls the vertical breakdown of the diode therefore limits the operating voltage of the diode 420.

FIG. 14 shows an alternate embodiment of device 11 provided as a high voltage N-channel Lateral DMOS (LDMOS) integrated with an existing low voltage device (not shown). Device 430 is the same as device 11 except that the active area of device 430 is configured as a N-channel LDMOS that includes a N+ source region 157 disposed in P-well 156 and a N+ drain contact pickup region 155 disposed in N-well 154. The P-well 156 is provided as the body and an N region including the N-well 154, a portion of the N-Epi layer 18 and the deep buried region 134 is provided as the drain. A field oxide 152 is formed on a top portion of the N-well 154 right next to the drain contact pickup region 155 and an insulated gate 150 disposed on top of the P-well 156 and the N-well 154 extends from overlapping a portion of the source region 157 to overlapping a portion of the field oxide 152. The distance 51 between a bottom of the P body region 162 and a top of the deep buried highly doped region 136 controls the vertical breakdown of the N-channel LDMOS therefore limits the operating voltage of the LDMOS 430.

A P-channel LDMOS 440 can be formed in a same way as shown in FIG. 15, except that the P+ source region 175 is now disposed in N-well 174 provided as the body and P+ drain contact pickup 177 is now disposed in P-well 176 provided as the drain. The distance 51 between a bottom of the P drain region 176 and a top of the deep buried highly doped region 136 controls the vertical breakdown of the P-channel LDMOS therefore limits the operating voltage of the LDMOS 440.

FIG. 16 shows an alternate embodiment of device 11 provided as a very high voltage N-channel Lateral DMOS (LDMOS) integrated with an existing low voltage device (not shown). Device 450 is the same as device 430 except that a RESURF region 137 is provided as a deep P-well (DPW) on a top portion of the deep lightly doped N buried region 134. The DPW region 137 depletes under reverse bias therefore functions as triple RESURF, thus, improves performance of previously described device 430. The DPW region 137 can be formed in the process around the step of 204 by implanting a P type dopant on a top portion of the P-Epi layer 16 in the high voltage device area at the same time or after regions 104 and 106 in FIG. 8 are implanted. Preferably the floating DPW region 137 is limited to a vicinity around the interface between p-epitaxial layer 16 and n-epitaxial layer 18. The distance 51 between a bottom of the P body region 156 and a top of the deep buried highly doped region 136 controls the vertical breakdown of the N-channel LDMOS therefore limits the operating voltage of the LDMOS 450.

This invention further discloses a method to make a device of increasing operating voltage over an existing device of same functionality by adding a few steps in the early manufacturing process of the existing device therefore without drastically affecting the device performance. Specifically after implanting the first and second ions of the second conductivity type and the ions of the first conductivity type in order to form isolation regions as described in FIGS. 5-6, a first epitaxial layer 16 of the first conductivity type is disposed on the substrate material 14. After implanting the ions of the first conductivity type for the regions 104 in FIG. 8, the epitaxial layer 18 is then disposed on top of the substrate material 14. By skipping most of the step 204 in FIG. 3 and only carrying out the manufacturing process in high voltage device area, higher operating voltage device compared to the FIG. 1 prior art device may be made. In this case the doping concentration of first epitaxial layer 16 may be different from that of the substrate material 14. The device shown in FIGS. 11-16 may be provided with improved operating voltage following the rest of standard processes and conditions.

It should be understood that the foregoing description is merely an example of the invention and that modifications may be made thereto without departing from the spirit and scope of the invention and should not be construed as limiting the scope of the invention. The scope of the invention, therefore, should be determined with respect to the appended claims, including the full scope of equivalents thereof.

The invention claimed is:

1. A method for forming a high voltage device and a low voltage device on a semiconductor substrate comprising:
 providing a semiconductor substrate of a first conductivity type;
 forming a deep buried implant region of a second conductivity type opposite to the first conductivity type on a top portion of the substrate in an area for the high voltage device;
 growing a first epitaxial layer of the first conductivity type on a top surface of the substrate, wherein forming the deep buried implant region includes diffusing first ions extending from a depth of the substrate to the top surface of the first epitaxial layer forming a deep buried lightly doped region and activating and diffusing second ions in a vicinity around an interface between the substrate and the first epitaxial layer forming a deep buried highly doped region surrounded by the deep buried lightly doped region;
 forming a buried implant region of the second conductivity type on a top portion of the first epitaxial layer in an area for the low voltage device;
 growing a second epitaxial layer of the second conductivity type on a top surface of the first epitaxial layer;
 forming a plurality of doped regions from a top surface of the second epitaxial layer in both the low voltage device area and the high voltage device area to form a low voltage device and a high voltage device respectively, with the dopant concentration of the first epitaxial layer being the same as the substrate, wherein the doping concentration of the deep buried lightly doped region is the same as the second epitaxial layer.

2. The method as recited in claim 1 wherein the step of forming a plurality of doped regions from a top surface of the second epitaxial layer in both the low voltage device area and the high voltage device area further comprising a step of forming a doped well of first conductivity type above the deep buried highly doped region, wherein the bottom of the doped well of first conductivity type is separated from the deep buried highly doped region, and a distance between the bottom of the doped well of first conductivity type and the top of the deep buried highly doped region controls a breakdown of the high voltage device.

3. The method as recited in claim 2 wherein the step of forming the buried implant region of second conductivity type further comprising implanting the second ions and activating and diffusing the second ions in a vicinity around an interface between the first epitaxial layer and the second epitaxial layer which forms a buried highly doped region.

4. The method as recited in claim 3 wherein the step of forming a plurality of doped regions from a top surface of the second epitaxial layer in both the low voltage device area and the high voltage device area further comprising a step of forming a doped well of first conductivity type above the buried highly doped region, wherein the bottom of the doped well of first conductivity type is separated from the buried highly doped region, and a distance between the bottom of the doped well of first conductivity type and the top of the buried highly doped region controls a breakdown of the low voltage device.

5. The method as recited in claim 4 further comprising forming isolation regions surrounding active areas of the high voltage device and low voltage device.

6. A method for forming a high voltage device and a low voltage device on a semiconductor substrate comprising;
   providing a semiconductor substrate of a first conductivity type;
   growing a first epitaxial layer of the first conductivity type on a top surface of the substrate;
   growing a second epitaxial layer of a second conductivity opposite to the first conductivity type on a top surface of the first epitaxial layer;
   forming a deep buried implant region of the second conductivity type in an area for the high voltage device;
   forming a buried implant region of the second conductivity type in an area for the low voltage device;
   forming a first doped well of the first conductivity type from a top surface of the second epitaxial layer above the deep buried implant region in the high voltage device area and a second doped well of the first conductivity type from a top surface of the second epitaxial layer above the buried implant region in the low voltage device respectively, with the step of forming the deep buried implant region of second conductivity type further comprising forming a deep buried highly doped region of the second conductivity type and deep buried lightly doped region of the second conductivity type surrounding the deep buried highly doped region and the deep buried lightly doped region extending from a depth of the substrate to a top surface of the first epitaxial layer and having a doping concentration the same as the second epitaxial layer.

7. The method as recited in claim 6 further comprising forming isolation regions surrounding active areas of the high voltage device and low voltage device.

8. A method for forming a plurality of devices on a semiconductor chip comprising:
   providing a substrate layer of a first conductivity type;
   implanting first and second ions of a second conductivity type opposite to the first conductivity type on a top portion of the substrate in a first device active area, wherein the first ions diffuse much faster than the second ions;
   growing a first epitaxial layer of the first conductivity type on top of the substrate;
   growing a second epitaxial layer of the second conductivity type on top of the first epitaxial layer;
   carrying out one or more thermal diffusion processes to diffuse the first ions so that they extend from a depth of the substrate to the top surface of the first epitaxial layer, forming a deep buried lightly doped region, and to diffuse the second ions into a deep buried highly doped region surrounded by the deep buried lightly doped region; and
   forming a first doped well of the first conductivity type extending downwards from a top surface of the second epitaxial layer above the deep buried highly doped region, with the deep buried lightly doped region of the second conductivity type having a doping concentration the same as the second epitaxial layer.

9. The method as recited in claim 8 further comprising adjusting a distance between a bottom of the first doped well of the first conductivity type and the deep buried highly doped region of the second conductivity type to set an operation voltage of the first device.

10. The method as recited in claim 8 further comprising a step of forming a NPN bipolar transistor in the first device active area wherein the first doped well is configured as a base of the NPN bipolar transistor.

11. The method as recited in claim 8 further comprising a step of forming a PNP bipolar transistor in the first device active area wherein the first doped well is configured as a collector of the PNP bipolar transistor.

12. The method as recited in claim 8 further comprising a step of forming a PN diode in the first device active area wherein the first doped well is configured as a anode of the PN diode.

13. The method as recited in claim 8 further comprising a step of forming a N-channel DMOS in the first device active area wherein the first doped well is configured as a base of the DMOS transistor.

14. The method as recited in claim 8 further comprising a step of forming a P-channel DMOS in the first device active area wherein the first doped well is configured as a drain of the DMOS transistor.

15. The method as recited in claim 8 further comprising a step of forming a buried doped region of the first conductivity type disposed above the deep buried highly doped region of the second conductivity type configured as a RESURF layer.

16. The method as recited in claim 8 further comprising forming isolation regions surrounding the first device active area and forming a buried implant region of the second conductivity type in a vicinity around an interface between the first epitaxial layer and the second epitaxial layer in a second device active area; and forming a second doped well of the first conductivity type extending downwards from the top surface of the second epitaxial layer above the buried implant region.

* * * * *